US006245155B1

(12) United States Patent
Leon et al.

(10) Patent No.: US 6,245,155 B1
(45) Date of Patent: *Jun. 12, 2001

(54) METHOD FOR REMOVING PHOTORESIST AND PLASMA ETCH RESIDUES

(75) Inventors: Vincent G. Leon, Scottsdale, AZ (US); Kenji Honda, Barrington, RI (US); Eugene F. Rothgery, North Branford, CT (US)

(73) Assignee: Arch Specialty Chemicals, Inc., Norwalk, CT (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/055,630

(22) Filed: Apr. 6, 1998

Related U.S. Application Data

(63) Continuation-in-part of application No. 08/709,053, filed on Sep. 6, 1996, now Pat. No. 5,780,406.

(51) Int. Cl.[7] ....................................... C23G 1/02
(52) U.S. Cl. .................... 134/3; 134/1.2; 134/2; 134/22.16; 134/22.17; 134/22.19; 134/25.4; 134/34; 134/36; 134/41; 134/902; 510/175; 510/176; 510/245; 510/254; 510/257; 510/259; 510/504
(58) Field of Search .................. 134/3, 1.2, 1.3, 134/2, 22.16, 22.17, 22.19, 25.4, 34, 36, 41, 902; 510/175, 176, 245, 254, 257, 259, 504

(56) References Cited

U.S. PATENT DOCUMENTS

| 4,341,592 | * | 7/1982 | Shortes et al. ...................... 156/643 |
| 4,749,640 | * | 6/1988 | Tremont et al. ..................... 430/314 |
| 5,181,985 |   | 1/1993 | Lampert et al. ..................... 156/635 |
| 5,314,576 |   | 5/1994 | Kadomura .......................... 156/655 |
| 5,378,317 |   | 1/1995 | Kashiwase et al. . |
| 5,464,480 |   | 11/1995 | Matthews . |
| 5,494,849 |   | 2/1996 | Iyer et al. ............................. 437/63 |
| 5,516,730 |   | 5/1996 | Saeed et al. ........................ 437/235 |
| 5,527,872 |   | 6/1996 | Allman ................................. 528/12 |
| 5,563,119 | * | 10/1996 | Ward .................................. 510/176 |
| 5,626,681 |   | 5/1997 | Nakano et al. .......................... 134/3 |
| 5,665,168 |   | 9/1997 | Nakano et al. .......................... 134/2 |
| 5,712,198 |   | 1/1998 | Shive et al. ......................... 437/235 |
| 5,727,578 | * | 3/1998 | Matthews .............................. 134/61 |
| 5,780,406 |   | 7/1998 | Honda et al. ....................... 510/175 |
| 5,911,837 | * | 7/1999 | Matthews ............................... 134/2 |
| 6,030,932 | * | 2/2000 | Leon et al. .......................... 510/175 |
| 6,033,993 | * | 3/2000 | Love, Jr. et al. ................... 438/745 |

FOREIGN PATENT DOCUMENTS 504431   10/1990   (EP) .
548596   11/1991   (EP) .

* cited by examiner

*Primary Examiner*—Sharidan Carrillo
(74) *Attorney, Agent, or Firm*—Ohlandt, Greeley, Ruggiero & Perle, LLP

(57) ABSTRACT

A method for the removing of plasma etch residues on a substrate comprising the steps of: (i) contacting the substrate with a cleaning composition, and (ii) contacting the substrate with ozonated water. The preferred cleaning composition has a pH from 2 to 6 and comprises: (A) water; (B) at least one selected hydroxylammonium compound; and (C) at least one basic compound; and optionally (D) a chelating stabilizer; and optionally (E) a surfactant.

17 Claims, No Drawings

METHOD FOR REMOVING PHOTORESIST AND PLASMA ETCH RESIDUES

This is a Continuation-In-Part of U.S. patent application Ser. No. 08/709,053, filed Sep. 6, 1996 U.S. Pat. No. 5,780,406 issued Jul. 14, 1998.

BACKGROUND OF THE INVENTION

1. Field of the Invention

This invention relates to a cleaning method for use in microelectronics manufacturing, and more particularly to a non-corrosive method for removing photoresist and plasma etch residues formed on wafer substrates after plasma etching of metal layers or oxide layers deposited on the substrates.

2. Brief Description of Art

In the manufacture of microcircuits, positive photoresists are used as an intermediate mask for transferring an original mask pattern of a reticule onto wafer substrates by means of a series of photolithography and plasma etching steps. One of the final steps in the microcircuit manufacturing process is the removal of the patterned photoresist films from the substrates. In general, this step is affected by one of two methods. One method involves a wet stripping step in which the photoresist-covered substrate is brought into contact with a photoresist stripper solution that consists primarily of an organic solvent and an amine. However, stripper solutions cannot completely and reliably remove the photoresist films, especially if the photoresist films have been exposed to UV radiation and plasma treatments during fabrication. Some photoresist films become highly crosslinked by such treatments and are more difficult to dissolve in the stripper solution. In addition, the chemicals used in these conventional wet stripping methods are sometimes ineffective for removing inorganic residual materials formed during the plasma etching of metal or oxide layers with halogen-containing gases.

An alternative method of removing a photoresist film involves exposing a photoresist-coated wafer to oxygen plasma in order to burn the resist film from the substrate surface in a process known as oxygen plasma ashing. Oxygen plasma ashing has become more popular in the microcircuit manufacturing process because it is carried out in a vacuum chamber and, hence, is expected to be less susceptible to airborne particulate or metallic contamination. However, oxygen plasma ashing is also not fully effective in removing plasma etching residues noted above. Instead, removal of these plasma etching residues must be accomplished by subsequently exposing the photoresist film to certain alkaline solutions. Several commercial products are now available to clean the plasma etching residues left by plasma etching followed by oxygen ashing. For example, EKC 265, available from EKC Technology, Inc., is a plasma etching cleaning solution composed of water, alkanolamine, catechol and hydroxylamine Such a composition is disclosed in U.S. Pat. No. 5,279,771 to Lee. ACT 935, available from Ashland Chemical, is another plasma etching cleaning solution and is composed of water, alkanolamine and hydroxylamine. In both cases, hydroxylamine is used as a corrosion inhibitor. R-10, a post-strip rinse available from Mitsubishi Gas Chemical, is composed of water, alkanolamine and a sugar alcohol, wherein the sugar alcohol acts as a corrosion inhibitor.

Although these commercial products can effectively dissolve plasma etching residues, the combination of water and alkanolamine contained therein can also attack the metallic layers deposited patternwise on the substrate. The addition of a corrosion inhibitor to these products can mitigate to a certain extent, the unwanted attack on the metallic layers and oxide layers deposited on the substrate. However, since these products have a pH above 11, even in the presence of a corrosion inhibitor, they may attack certain corrosion-sensitive metal layers. Particularly, metal layers such as aluminum or aluminum alloys (e.g., Al—Cu—Si), titanium nitride, titanium tungsten and the like are particularly corrosion sensitive. Furthermore, while the addition of a suitable corrosion inhibitor is essential to prevent corrosion of the substrate metal layers, the corrosion inhibitor must not inhibit the removal of the plasma etching residue.

It is difficult to balance effective plasma etching residue removal corrosion inhibition because chemical compositions of the plasma etching residues are generally similar to those of the metal layers or oxide layers on the substrate. The alkanolamine used in the prior art cleaning compositions was oftentimes found to attack both the plasma etching residue and the substrate metal layers. Moreover, if a post-cleaner rinse such as isopropyl alcohol is not used, the corrosion could be very severe. In addition, some types of the corrosion inhibitors have been found to retard plasma etching residue removal. There has also always been a tradeoff between speed of plasma etching residue removal and substrate metal layer corrosion inhibition. Accordingly, there has remained a need for a method of quickly and effectively removing the plasma etching residues without causing metal layer corrosion Several other patents in the photoresist stripper/cleaner application field exist as follows, although none of them disclose the use of the method or compositions of the present invention:

Japanese Patent Application No. 7-028254, assigned to Kanto Kagaku, discloses a non-corrosive resist removal liquid comprising a sugar alcohol, an alcohol amine, water, and a quaternary ammonium hydroxide.

PCT Published Patent Application No. WO 88-05813 teaches a positive or negative photoresist stripper containing butyrolactone or caprolactone, quaternary ammonium hydroxide compound, and optionally, a nonionic surfactant.

U.S. Pat. No. 4,239,661 to Muraoka et al. discloses a surface-treating agent comprising an aqueous solution of 0.01% to 20% trialkyl (hydroxyalkyl) ammonium hydroxide. This agent is useful in removing organic and inorganic contaminants deposited on the surface of intermediate semiconductor products.

U.S. Pat. No. 4,904,571 to Miyashita et al. teaches printed circuit board photoresist stripper composition containing a solvent (e.g., water, alcohols, ethers, ketones, and the like), an alkaline compound dissolved in the solvent, including quaternary ammonium hydroxide, and a borohydride compound dissolved in the solvent.

U.S. Pat. No. 5,091,103 to Dean et al. teaches a positive photoresist stripping composition containing: (A) N-alkyl-2-pyrrolidone; (B) 1,2-propanediol; and (C) tetraalkylammonium hydroxide.

U.S. Pat. No. 5,139,607 to Ward et al. teaches positive and negative photoresist stripping composition containing: (A) tetrahydrofurfuryl alcohol; (B) a polyhydric alcohol (e.g., ethylene glycol or propylene glycol); (C) the reaction product of furfuryl alcohol and an alkylene oxide; (D) a water-soluble Bronstead base type hydroxide compound (e.g., alkali metal hydroxide, ammonium hydroxide and tetramethyl ammonium hydroxide); and (E) water. Optionally, the composition may also contain up to 1% of a nonionic surfactant.

U.S. Pat. No. 5,174,816 to Aoyama et al. discloses a composition for removing chlorine remaining on the surface of an aluminum line pattern substrate after dry etching, which composition comprises an aqueous solution containing 0.01 to 15% by weight of a quaternary ammonium hydroxide, such as trimethyl (2-hydroxyethyl) ammonium hydroxide, and 0.1 to 20% by weight of sugar or sugar alcohol, such as xylitol, mannose, glucose and the like.

Other compositions used to strip photoresist include a solution of $H_2SO_4$ and an oxidizing agent such as $H_2O_2$ that oxidizes, and thus decomposes organic photoresists. However, solutions containing strong acids and oxidizing agents are hazardous to handle, must be applied at elevated temperatures, and require a hot deionized (DI) water rinse to prevent sulfates from crystallizing on the substrate. Also, such solutions have a short active life as the oxidizing agent readily decomposes. Thus, it is necessary to frequently replenish the solutions. The need for solution replenishment renders the process both hazardous and economically inefficient.

Compared to the foregoing process, the use of a mixture of $H_2SO_4$ and ozone ($O_3$) provides for improved active life since $O_3$ can be bubbled continuously into the solution to maintain oxidation efficiency. However, when plasma etch or a high concentration of arsenic is used in ion implantation, the photoresist film is not completely removed. Also, $O_3$ has limited solubility in $H_2SO_4$. U.S. Pat. No. 5,378,317 discloses the application of a solution of $H_2SO4/H_2O_2$ or oxygen plasma ashing followed by a treatment with ozone containing water. However, this process is not capable of removing plasma etch residues such as aluminum oxide, silicon oxide, or aluminum chloride.

Therefore, there remains a need for a method for removing photoresist and plasma etch residues from substrates. Additionally, there remains a need for such a method that does not deleteriously affect the substrate. Further, there remains a need for such a method that uses aqueous-based, non-hazardous cleaning compositions that will not harm the environment.

BRIEF SUMMARY OF THE INVENTION

The present invention is directed to a non-corrosive cleaning method useful for removing photoresist and plasma etch residues from a substrate. The method comprises the steps of:

(i) contacting the substrate with an aqueous based cleaning composition having a substantially neutral or mildly acidic pH; and (ii) rinsing the substrate with ozonated water.

DETAILED DESCRIPTION OF A PREFERRED EMBODIMENT

In the first step of the method of the present invention, the substrate is contacted with an aqueous-based cleaning composition having a substantially neutral or slightly acidic pH. One particularly suitable cleaning composition is Microstrip 5002, commercially available from Olin Microelectronic Materials. This stripping solution is described in copending U.S. patent application Ser. No. 08/709,053, allowed Feb. 20, 1998, the subject matter of which is incorporated herein by reference, and comprises (a) water; (b) at least one hydroxylammonium compound selected from the group consisting of hydroxylammonium salts of the formula (I):

$$n(NR_1R_2R_3OH)^+(X^{-n}) \qquad (I)$$

wherein $R_1$, $R_2$ and $R_3$ are individually selected from hydrogen, lower alkyl groups having 1 to 4 carbon atoms, lower alkoxy groups having 1 to 4 carbon atoms, hydroxyl and hydroxyl-substituted lower alkyl groups having 1 to 4 carbon atoms, with the proviso that at least two of $R_1$, $R_2$ and $R_3$ are either hydrogen, lower alkyl group or lower alkoxy group, and wherein X is an anionic moiety that is soluble in water and compatible with said quaternary ammonium hydroxide radical; and n is the valence of X and is from 1 to 3; and (c) at least one basic compound selected from the group consisting of amines and quaternary ammonium hydroxides.

The amount of acidic hydroxylammonium compound relative to the amount of basic amine and/or quaternary ammonium hydroxide is adjusted such that the pH of the overall composition is maintained within the range of about 2 to about 6, preferably within a range from about 2 to about 4. In addition to contributing to the removal of the plasma etching residues, the acidic hydroxylammonium compound inhibits metal attack. Due to the corrosion inhibiting action of acidic component, and the substantially neutral, or only mildly acidic pH, such compositions can be used in the absence of an additional corrosion inhibiting component.

Acidic hydroxylammonium compounds that can be used to form cleaning composition suitable for use with the cleaning method of the invention include hydroxylammonium salts such as hydroxylammonium nitrate (also referred to as HAN), hydroxylammonium sulfate (also referred to as HAS), hydroxylammonium phosphate, hydroxylammoniun chloride, hydroxylammonium oxalate, hydroxylammonium citrate, hydroxylammonium fluoride, hydroxylammonium chloride, and the like. Alkyl-substituted derivatives of hydroxylammonium salts are also useful: e.g. hydroxyl diethylammonium salts and the like. Preferably, the hydroxylammonium compound is present in the composition of the invention in the range of about 1% to about 70% by weight.

Amines that can be used as the basic component of cleaning compositions useful in the practice of the cleaning method of the invention include hydroxylamine and other alkanolamines such as monoethanolamine, diethanolamine, triethanolamine, diethylene-glycolamine, N-hydroxylethylpiperazine, and the like. Quaternary ammonium hydroxides that can be used as the basic component of cleaning compositions suitable for use in the practice of the cleaning method of the invention include tetraalkylammonium hydroxides having methyl, ethyl, propyl, butyl, hydroxyethyl, and the combinations thereof (e.g., tetramethylammonium hydroxide (hereinafter referred to as TMAH), tetraethyl-ammonium hydroxide, trimethyl hydroxyethylammonium hydroxide, methyl tri (hydroxyethyl) ammonium hydroxide, tetra (hydroxyethyl) ammonium hydroxide, benzyl trimethylammonium hydroxide and the like). Additionally, a combination of ammonium hydroxide with one or more quaternary ammonium hydroxides may also be used. Preferably, the basic compound is present in the cleaning composition of the invention in the range of about 0.01% to about 10% by weight. The balance of cleaning composition can comprise substantially of water.

A chelating stabilizer may be optionally included in the cleaning composition to stabilize the hydroxylammonium salts. Suitable chelating stabilizers include triethylenetetramine (hereinafter referred to as TETA); 2,2'-[[methyl-1H-benzotriazol-1-yl)methyl]imino]bisethanol (Tradename is IRGAMET 42), (2-benzothiazolythio)succinic acid (Tradename is IRGACOR 252), tricine, bicine, and other water-soluble chelating compounds. Preferably, the stabilizer is present in the composition of the invention in the range of about 5 ppm to about 5000 ppm by weight based on the a total weight of cleaning composition.

A surfactant may also be optionally included in the cleaning composition so as to enhance the power of the plasma etching residue removal from the substrate. Suitable surfactants are selected from nonionic types, cationic types and anionic types of surfactants. Preferably, a surfactant is present in the composition of the invention in the range of about 0.1 ppm to about 100 ppm by weight to a total weight of the cleaning composition. The cleaning composition may also, optionally, contain a minor amount of a corrosion inhibitor such as sugar alcohols, catechol and the like.

The substrate can be contacted with the cleaning composition by any suitable method, such as by placing the cleaning composition into a tank and submerging the substrates into the cleaning composition. Preferably, the substrates are spray rinsed with the cleaning composition. The substrates can then be contacted with the ozonated water using any suitable method, such as by placing the ozonated water into a tank where the substrates can be submerged into the water. Preferably, the substrates previously contacted with the cleaning composition are rinsed with the ozonated water using a spray rinse.

The ozonated water can be a simple mixture of ozone and ultra-pure water, e.g., DI water. The ozone can be generated by any conventional means, e.g., an ozone generator. The mixing of the ozone and water may be achieved by any suitable method, such as jetting the ozone into the water by a gas feed nozzle; feeding the water and ozone into a spiral mixer; aspirating the gas into the flow of water; and feeding the ozone into a treatment tank regulated at a given pressure so that ozone is dissolved into the water.

The cleaning method of the present invention can also be used in combination with a dry stripping process. Dry stripping is typically conducted prior to the present cleaning method. Any suitable dry stripping process can be used including $O_2$ plasma ashing, ozone gas phase-treatment, fluorine plasma treatment, hot $H_2$ gas treatment (described in U.S. Pat. No. 5,691,117), and the like. The preferred dry stripping process is $O_2$ plasma ashing.

In addition, the cleaning method can also be used in combination with a organic wet stripping method. The organic wet strip can be performed either before, after, or both before and after the cleaning method of the present invention. Any conventional organic wet stripping solution can be used and a person skilled in the art would be able to choose the appropriate organic wet stripper. Thus, the cleaning method of the invention can be used to replace the organic solvent-based post-strip rinse. Because the preferred cleaning composition is a non-corrosive and neutral to weakly acidic aqueous solution and will not harm the environment. Furthermore, the cleaning compositions used in the present cleaning method may be disposed of in a regular drain system for aqueous chemical wastes.

While the invention has been described above with reference to specific embodiments thereof, it is apparent that many changes, modifications and variations can be made without departing from the inventive concept disclosed herein. Accordingly, it is intended to embrace all such changes, modifications and variations that fall within the spirit and broad scope of the appended claims. All patent applications, patents and other publications cited herein are incorporated by reference in their entirety.

What is claimed is:

1. A cleaning method for removing photoresist and plasma etch residues from a substrate comprising the steps of:
    (i) contacting said substrate with an aqueous based cleaning composition having a pH of from about 2 to about 6, wherein said cleaning composition comprises:
        (a) water;
        (b) at least one basic compound selected from the group consisting of amines or quaternary ammonium hydroxides; and
        (c) at least one acidic hydroxylammonium compound; and
    (ii) rinsing said substrate with ozonated water.

2. The method of claim 1, wherein said cleaning composition has a pH of from about 2 to about 4.

3. The method of claim 1, wherein said substrate is contacted with said aqueous based cleaning composition by spraying said substrate with said cleaning composition.

4. The method of claim 1, wherein said substrate is rinsed with said ozonated water by spray rinsing.

5. The method of claim 1, further comprising a step of subjecting said substrate to dry stripping.

6. The method of claim 1, further comprising a step of subjecting said substrate to organic wet stripping.

7. The method of claim 1, wherein said acidic hydroxylammonium compound is selected from the group consisting of hydroxylammonium salts of the formula:

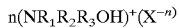

$$n(NR_1R_2R_3OH)^+(X^{-n})$$

wherein $R_1$, $R_2$ and $R_3$ are individually selected from hydrogen, lower alkyl groups having 1 to 4 carbon atoms, lower alkoxy groups having 1 to 4 carbon atoms, hydroxyl and hydroxyl-substituted lower alkyl groups having 1 to 4 carbon atoms, with the proviso that at least two of $R_1$, $R_2$ and $R_3$ are hydrogen, lower alkyl group or lower alkoxy group; and wherein X is an anionic moiety that is soluble in water and compatible with said amines or quaternary ammonium hydroxides; and n is the valence of X and is from 1 to 3.

8. The method of claim 1, wherein said hydroxylammonium compound is selected from the group consisting of hydroxylammonium nitrate, hydroxylammonium sulfate, hydroxylammonium phosphate, hydroxylammonium oxalate, hydroxylammonium citrate, hydroxylammonium fluoride and hydroxylammonium chloride.

9. The method of claim 1, wherein the amount of hydroxylammonium compound is from about 1% to about 70% by weight of said cleaning composition.

10. The method of claim 1, wherein said amine is selected from the group consisting of hydroxylamine, monoethanolamine, diethanolamine, triethanolamine, diethyleneglycolamine, and N-hydroxyethylpiperazine.

11. The method of claim 1, wherein said quaternary ammonium hydroxide is selected from the group consisting of tetramethylammonium hydroxide, tetraethyl-ammonium hydroxide, trimethyl hydroxyethylammonium hydroxide, methyl tri (hydroxyethyl) ammonium hydroxide, tetra (hydroxyethyl)ammonium hydroxide, and benzyl trimethylammonium hydroxide.

12. The method of claim 1, wherein the amount of said basic compound in the cleaning composition is from about 0.01% to about 10% by weight of said cleaning composition.

13. The method of claim 1, wherein said cleaning composition further comprises a chelating compound selected from the group consisting of triethylenetetramine, 2,2'-[[(methyl-1-H-benzotriazoil-1-yl)methyl]imino]bisethanol, and (2-benzothiazolythio) succinic acid.

14. The method of claim 1, wherein said cleaning composition further comprises a surfactant selected from the group consisting of nonionic surfactants, cationic surfactants and anionic surfactants.

15. The method of claim 1, wherein said cleaning composition further comprises a corrosion inhibitor selected from the group consisting of: sugar alcohols and catechol.

16. The method of claim 5, wherein said dry stripping is a plasma oxygen ashing.

17. The method of claim 5, wherein said step of dry stripping is conducted prior to contacting said substrate with said aqueous-based cleaning composition.

* * * * *